United States Patent
Doorenbos et al.

(10) Patent No.: US 10,848,175 B2
(45) Date of Patent: Nov. 24, 2020

(54) TEMPERATURE SENSING WITH BANDGAP SENSOR INPUT TO SIGMA-DELTA ADC

(71) Applicant: TEXAS INSTRUMENTS INCORPORATED, Dallas, TX (US)

(72) Inventors: Jerry Lee Doorenbos, Tucson, AZ (US); Keith Eric Sanborn, Tucson, AZ (US); Srikanth Vellore Avadhanam Ramamurthy, Tucson, AZ (US); Mina Raymond Naguib Nashed, Tucson, AZ (US); Dwight David Griffin, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/564,059

(22) Filed: Sep. 9, 2019

(65) Prior Publication Data
US 2020/0007148 A1    Jan. 2, 2020

Related U.S. Application Data

(63) Continuation of application No. 16/054,877, filed on Aug. 3, 2018, now Pat. No. 10,461,771.
(Continued)

(51) Int. Cl.
  *H03M 3/00*    (2006.01)
(52) U.S. Cl.
  CPC .............. *H03M 3/494* (2013.01); *H03M 3/38* (2013.01); *H03M 3/464* (2013.01)
(58) Field of Classification Search
  CPC .......... H03M 3/30; H03M 1/00; H03M 1/002; H03M 1/1042; H03M 1/12; H03M 1/123;
(Continued)

(56) References Cited

U.S. PATENT DOCUMENTS 5,821,890 A    10/1998  Kim et al.
6,873,276 B2 *  3/2005  Yang ..................... H03M 3/368
                                                341/143
(Continued)

FOREIGN PATENT DOCUMENTS

EP          0541878       5/1993
KR       20110139930      12/2011

OTHER PUBLICATIONS

International Search Report in corresponding PCT Application No. PCT/US2019/023239, dated Jun. 27, 2019 (2 pages).

*Primary Examiner* — Linh V Nguyen
(74) *Attorney, Agent, or Firm* — John R. Pessetto; Charles A. Brill; Frank D. Cimino

(57) ABSTRACT

In some examples, a sigma-delta analog-to-digital converter (ADC), comprises a first set of switches configured to receive a first voltage signal; a second set of switches coupled to the first set of switches at a first node and a second node, the second set of switches configured to receive a second voltage signal; an integrator including a first input sampling capacitor coupled to the first node and a second input sampling capacitor coupled to the second node, wherein the integrator configured to generate a first output signal. The sigma-delta ADC further comprises a comparator coupled to the integrator and configured to generate a second output signal based on the first output signal; and a controller unit having a first counter, a second counter, and a processor, the controller unit coupled to the first and second sets of switches, the integrator, and the comparator.

9 Claims, 4 Drawing Sheets

Related U.S. Application Data

(60) Provisional application No. 62/647,092, filed on Mar. 23, 2018, provisional application No. 62/645,209, filed on Mar. 20, 2018.

(58) Field of Classification Search
CPC ...... H03M 1/1245; H03M 1/66; H03M 1/804; H03M 3/32; H03M 3/34; H03M 3/458
USPC .................................. 341/118–120, 143, 172
See application file for complete search history.

(56) References Cited

U.S. PATENT DOCUMENTS

| | | | |
|---|---|---|---|
| 7,038,532 B1 * | 5/2006 | Bocko | G06G 7/186 327/337 |
| 7,524,109 B2 | 4/2009 | Gardner et al. | |
| 7,564,389 B1 * | 7/2009 | Byrd | H03M 3/39 341/143 |
| 8,766,833 B1 | 7/2014 | Bogner | |
| 8,791,846 B2 | 7/2014 | Cho et al. | |
| 8,830,098 B2 * | 9/2014 | Mir | H03M 3/378 341/143 |
| 9,413,383 B1 | 8/2016 | Sharma | |
| 2003/0210166 A1 * | 11/2003 | Liu | H03M 3/34 341/172 |
| 2005/0156769 A1 | 7/2005 | O'Dowd et al. | |
| 2008/0024342 A1 * | 1/2008 | Deval | H03M 3/34 341/143 |
| 2009/0079607 A1 | 3/2009 | Denison et al. | |
| 2012/0268301 A1 | 10/2012 | Thachile | |
| 2014/0167991 A1 * | 6/2014 | Oshita | H03M 3/458 341/143 |
| 2015/0295587 A1 * | 10/2015 | Garcia Gonzalez | H03M 3/382 341/121 |
| 2015/0381183 A1 | 12/2015 | Schultz et al. | |
| 2015/0381194 A1 | 12/2015 | Motz et al. | |
| 2016/0013804 A1 | 1/2016 | Peluso | |
| 2017/0237268 A1 | 8/2017 | Brannick et al. | |

* cited by examiner

TEMPERATURE SENSING WITH BANDGAP SENSOR INPUT TO SIGMA-DELTA ADC

CROSS-REFERENCE TO RELATED APPLICATIONS

This application is a continuation of U.S. application Ser. No. 16/054,877, filed 2018 Aug. 3, which claims priority claims priority to U.S. Provisional Patent Application No. 62/645,209, which was filed Mar. 20, 2018 and is titled "Temperature-Sensing Hybrid Sigma-Delta/SAR Analog-to-Digital Converter and Method for Digital Calibration," and U.S. Provisional Patent Application No. 62/647,092, which was filed Mar. 23, 2018 and is titled "Temperature-Sensing Hybrid Sigma-Delta/SAR Analog-to-Digital Converter and Method for Digital Calibration," both of which are hereby incorporated herein by reference in their entirety.

BACKGROUND

Sigma-delta analog-to-digital converters (ADCs) are often employed in applications that require sensing of low-frequency input signals. In some cases, the low-frequency input signals can be signals received via sensors that detect, for instance, temperature.

SUMMARY

In accordance with at least one example of the disclosure, a sigma-delta analog-to-digital converter (ADC), comprises a first set of switches configured to receive a first voltage signal; a second set of switches coupled to the first set of switches at a first node and a second node, the second set of switches configured to receive a second voltage signal; an integrator including a first input sampling capacitor coupled to the first node and a second input sampling capacitor coupled to the second node, wherein the integrator configured to generate a first output signal. The sigma-delta ADC further comprises a comparator coupled to the integrator and configured to generate a second output signal based on the first output signal; and a controller unit having a first counter, a second counter, and a processor, the controller unit coupled to the first and second sets of switches, the integrator, and the comparator, wherein the processor is configured to increment a first counter value of the first counter based on the second output signal and a second counter value of the second counter based on the second output signal, wherein the processor is configured to compute a value based on the first and second counter values.

In accordance with at least one example of the disclosure, a sigma-delta analog-to-digital converter (ADC), comprises an integrator including a pair of input sampling capacitors that are coupled to a first node and second node, wherein the first and second nodes are configured to receive a first voltage signal; a digital-to-analog converter (DAC) coupled to the first and second nodes, wherein the first and second nodes are configured to receive a second voltage signal, wherein the integrator is configured to generate a first output signal based on either the first or second input signal; a comparator coupled to the integrator and configured to generate a second output signal based on the first output signal; and a controller coupled to the comparator, integrator, and the DAC, wherein the controller is configured to compute a value based on the second output signal.

In accordance with at least one example of this disclosure, a method comprises receiving a first voltage signal via a first set of switches; receiving a second voltage signal via a second set of switches, wherein the first set of switches is coupled to the second set of switches at a first node and a second node, an integrator with input sampling capacitor is coupled to the first node and a second input sampling capacitor is coupled to the second node; examining a first output signal of a comparator. The method, in response to the first output signal, further comprises incrementing, by a controller unit, a first counter value and a second counter value based on the first output signal, the controller unit is coupled to the first and second sets of switches, an integrator, and a comparator; generating a second output signal by the integrator based on either one of the first and second voltage signals; and computing, by the controller unit, a value based on the first and second counter values.

BRIEF DESCRIPTION OF THE DRAWINGS

For a detailed description of various examples, reference will now be made to the accompanying drawings in which.

DETAILED DESCRIPTION

Figure 1:
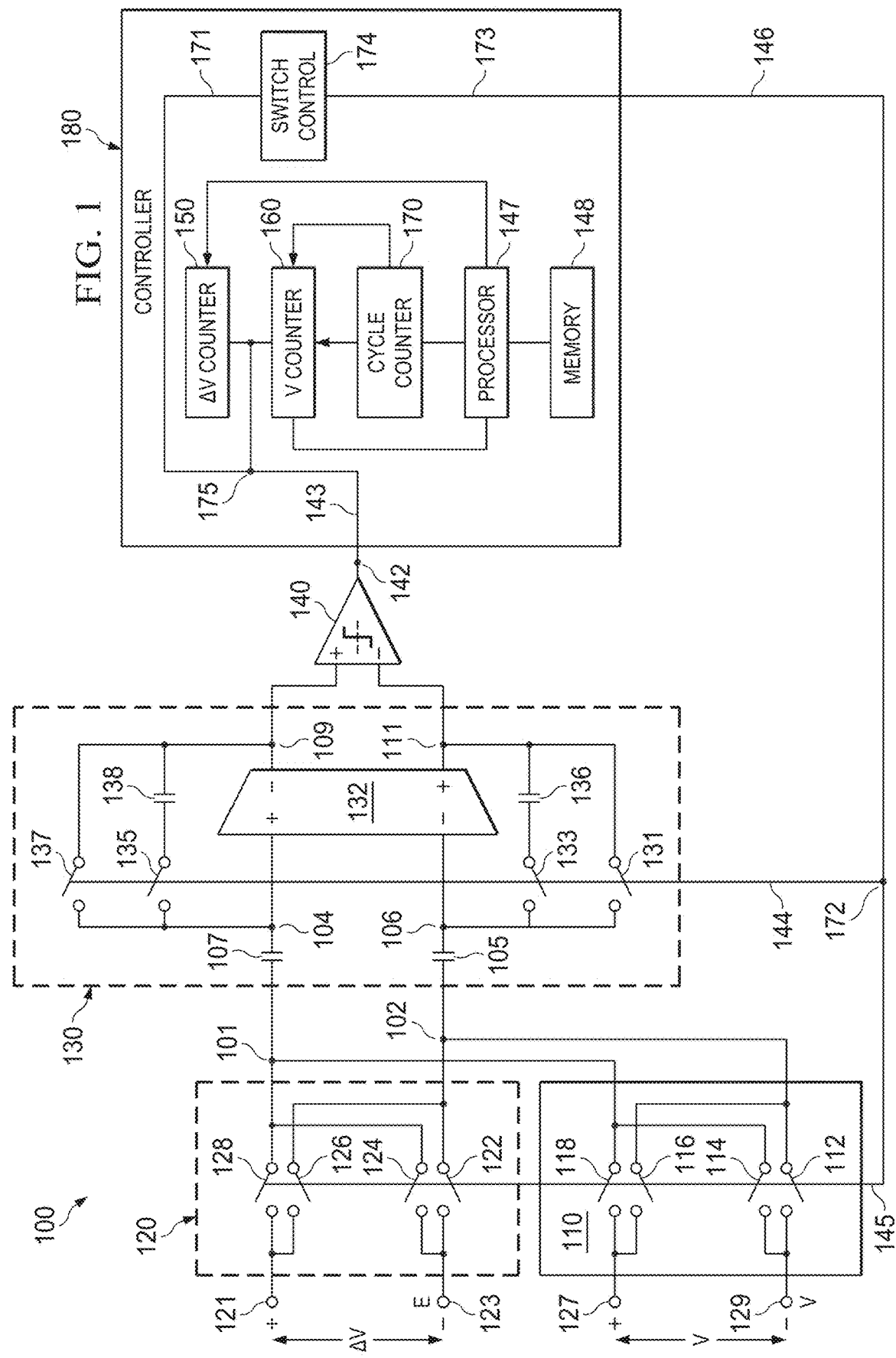
FIG. 1 depicts an illustrative hybrid sigma-delta analog-to-digital converter (ADC), in accordance with various examples.

As noted above, the sigma-delta ADC receives low-frequency input signals via sensors that detect, for instance, temperature. The temperature detected by the sensors typically results in a continuous-time and continuous-amplitude analog signal, and additional circuitry such as the sigma-delta ADC is required to provide a digital reading of the temperature. To perform this sensing function, the sigma-delta ADC employs a combination of analog and digital circuitry. The analog circuitry, in some cases, includes a switched-capacitor integrator (or a differential amplifier with capacitive feedback and input sampling capacitors), a comparator, and a digital-to-analog converter (DAC). The digital circuitry, in some cases, includes a counter and a controller circuit. The analog circuitry outputs a digital pulse stream (e.g., a sequence of binary numbers) representing the low-frequency input signal in the digital domain. This digital pulse stream is provided to the counter, which counts the number of digital 1s and 0s, and the ratio of the number of 1s to 0s computed in the controller circuit represents a mean value of the low-frequency input signal.

For the above-mentioned sensing function to work properly, the sigma-delta ADC utilizes a reference signal that, in some cases, is received by the DAC. The reference signal acts as a reference value which is utilized, at least in part, to calculate the temperature value. This reference signal can be generated using a variety of techniques. One such technique involves using a dedicated bandgap reference circuit that provides the reference signal to the DAC. However, using the dedicated bandgap reference circuit necessitates additional power, which increases the overall power consumption of the sigma-delta ADC. Also, the bandgap circuit occupies additional silicon area on a semiconductor die.

An alternate technique involves generating the reference value by reusing the low-frequency input signal (hereinafter "input analog signal") and eliminating the use of the dedicated bandgap reference circuit. The alternative technique includes increasing the number of sampling capacitors and composing the reference value by a piece-wise sampling of the input analog signals by the sampling capacitors. However, the accuracy of such sigma-delta ADCs relies significantly on the type of capacitors employed. For higher accuracy, capacitors with low voltage coefficients (also referred to as "precision capacitors") that are more accurate—relative to a metal-oxide-semiconductor (MOS) capacitor—are employed. From a fabrication perspective, the precision capacitors occupy relatively more silicon area than the MOS capacitors. As a result, this alternative approach has an inherent trade-off between accuracy and silicon area.

A solution that addresses the issues mentioned above is desired. Accordingly, at least some of the examples disclosed herein are directed toward a hybrid sigma-delta ADC that is configured to sense low-frequency signals. The hybrid sigma-delta ADC disclosed herein overcomes the shortcomings of the typical sigma-delta ADC mentioned above. The hybrid sigma-delta ADC utilizes only two precision input-sampling capacitors, thereby saving silicon area. The hybrid sigma-delta ADC, in some examples, is configured to utilize the digital circuitry and digitally produce the reference value (hereinafter "digitally produced reference value"). The digitally produced reference value saves silicon area previously utilized in either having a dedicated reference generation circuit where the reference signal acts as the reference value or in the alternative approach where an increased number of sampling capacitors compose the reference value. Since the digital circuitry is generating the reference value, the overall power consumption of the hybrid sigma-delta ADC—relative to the typical sigma-delta ADC—is low. As further described below, the hybrid nature of the hybrid sigma-delta ADC allows the ADC to work in a sub-ranging mode that results in an increased resolution of the ADC. This, as further described below, is performed by reducing a residue value of the ADC. In some examples, the residue value is further reduced and the resolution is further increased by employing a cyclic-successive approximation register (cyclic-SAR) algorithm.

Referring now to FIG. 1, an illustrative hybrid sigma-delta ADC 100 (hereinafter "Σ-Δ ADC 100") in accordance with various examples is shown. The Σ-Δ ADC 100 includes an analog circuitry that comprises a digital-to-analog converter (DAC) 110 configured to receive an input signal (or voltage signal) "V" via input terminals 127, 129. The example DAC 110 of FIG. 1 includes a set of switches comprising switches 112, 114, 116, and 118, and therefore, the DAC 110 is sometimes referred to as a set of switches. The Σ-Δ ADC 100 comprises a switch network 120 that couples to the DAC 110 at nodes 101, 102, and the switch network 120 is configured to receive an input signal (or voltage signal) "ΔV" via the input terminals 121, 123. The Σ-Δ ADC 100 includes an integrator 130 and a comparator 140 that are coupled to each other such that—as further described below—the output of the comparator 140 depends on the output of the integrator 130. The integrator 130 includes a single set of sampling capacitors (also sometimes referred to as input sampling capacitors) that are configured to sample, in some examples, the input signal ΔV, the input signal V, or a combination of both input signals ΔV and V. The set of sampling capacitors includes sampling capacitors 105, 107, and are, in some examples, precision capacitors.

The Σ-Δ ADC 100 includes digital circuitry that, in some examples, comprises a controller unit 180 (hereinafter "controller 180") that includes: a ΔV counter 150 that changes its count value at different time instances based on the comparator 140 output; a V result counter 160 that changes its count value at different time instances based on the comparator 140 output; a cycle counter 170 that counts the number of integration cycles of the integrator 130; and based on the comparator 140 output, a switch control 174 is configured to control the turning on/off of the switches present in the DAC 110, switch network 120, and the switches (e.g., switch 131, 133, 135 and 137) present in the integrator 130. The ΔV result counter 150 (hereinafter "counter 150") is coupled to the V result counter 160 (hereinafter "counter 160") at a node 175. The cycle counter 170 (hereinafter "counter 170") is coupled to the counter 150 and to the counter 160. The controller unit 180, in some examples, includes a processing unit (or a processor) 147 (hereinafter processor 147) and memory 148 (e.g., RAM (random-access memory), ROM (read-only memory)), which may include any suitable type of non-transitory computer-readable medium storing machine-executable instructions. The machine-executable instructions, when executed by the processor 147, cause the processor 147 to perform one or more of the actions attributed herein to the controller unit 180 and/or the components in the controller unit 180. In some examples, the processor 147 is configured to store additional information in the memory 148 and insert values in the counters 150, 160 at different time instances. The processor 147 is also configured to receive cycle counter information and respond based on the received information. In some examples, the processor 147 couples to the switch control 174 and, at least partially, controls its function.

The controller unit 180 is configured to receive the output of the comparator 140 present at a node 142 via the wire 143. This received signal may act as an input to the controller unit 180. The controller unit 180 is configured to generate an output via a wire 146. In some examples, the signal at the wire 146 is received form the switch control 174 via a wire 173. In some examples, the signal at the wire 146 is based on the signal at the node 142. In some examples, the signal at the wire 146 is configured to control the turning on/off of the switches present in the DAC 110, switch network 120, and the switches present in the integrator 130. In some examples, a wire 144 couples to the switches in the integrator 130, and a wire 145 couples to the switches present in the DAC 110 and the switch network 120. The wires 144, 145 couple at a node 172 that couples to the wire 146. In some examples, the controller unit 180, based on the signal at the node 142, is configured to turn on/off switches present in the integrator 130 via a wire 144. The controller unit 180, at least partially based on the signal at the node 142, is configured to turn on/off switches present in the DAC 110 via the wire 145. The controller unit 180, at least partially based on the signal at the node 142, is configured to turn on/off switches present in the input switch network 120 via the wire 145. The wires 143, 144, 145, 146 are depicted in FIG. 1 to be single wires. However, from an implementation standpoint, the wires 143, 144, 145, 146 may be a collection of wires, also sometimes referred to as busses.

As noted above, the Σ-Δ ADC 100 receives input signals from a sensor (not expressly shown) detecting slow-varying (or low-frequency) values such as temperature. The sensors, in some examples, include one or more transistors (not expressly shown), such as bipolar junction transistors (BJT), operating at different current densities. A voltage change at the terminals of such BJTs is measured to perform the temperature sensing function. Therefore, the input signal V, in some examples, is a voltage differential between two terminals of one of the BJTs utilized in such sensors. The input signal ΔV, in some examples, is the difference (or delta) between a voltage differential between terminals of two of the BJTs operating at different current densities. For example, assume that a temperature sensor employs a first BJT and a second BJT. The input signal V, in such an example, is the base-to-emitter voltage of the first BJT, and the input signal ΔV is the difference between base-to-emitter voltages of the first BJT and the second BJT. In some examples, one of the voltages of the differential voltage may be coupled to a ground source.

In some examples, the input signal V acts as a reference signal to the DAC 110. The reference signal (or the input signal V) need not be generated using additional circuitry as it is already available via the temperature sensor mentioned above. This disclosure describes using the input signals V, ΔV, and utilizing the above-mentioned digital circuitry to generate the digitally produced reference value for a precise reading of the temperature.

In some examples, the input switch network 120 includes more than one switch or a set of switches. The switch network, as noted above, is configured to receive the input signal ΔV. In some examples, the input switch network 120 includes switches 122, 124, 126, and 128, which can be turned on/off in a fashion to provide a signal that is a function of the input voltage ΔV to the nodes 101, 102. For example, a +ΔV voltage signal can be introduced to the nodes 101, 102 by turning on the switches 122, 128, and turning off the switches 124, 126. On the other hand, a −ΔV voltage signal can be provided to the nodes 101, 102 by turning off the switches 122, 128, and turning on the switches 124, 126. In some examples, the turning on and off of the switches 122, 124, 126, and 128 is controlled by a control signal sent by the controller unit 180 via a wire 145.

In some examples, the DAC 110 includes a set of switches comprising switches 112, 114, 116, and 118, which are configured to receive the input signal V. Similar to the input switch network 120, the switches 112, 114, 116, and 118 can be turned on/off to provide a signal that is a function of the input signal V to the nodes 101, 102. For example, a −V voltage signal can be provided to the nodes 101, 102 by turning on the switches 114, 116, and turning off the switches 112, 118. On the other hand, a +V voltage signal can be provided to the nodes 101, 102 by turning off the switches 114, 116, and turning on the switches 112, 118. The turning on and off of the switches 112, 114, 116, and 118 is controlled by a control signal sent by the controller unit 180 via the wire 145.

As noted above, the integrator 130, in some examples, includes sampling capacitors 105 and 107. The sampling capacitor 105 couples to the node 102 and the node 106. The sampling capacitor 107 couples to the node 101 and the node 104. The signal from the nodes 101, 102 is sampled by the sampling capacitors 107 and 105, respectively. Integrator 130 generates, based on the sampled signal across capacitors 105 and 107, an output signal at the nodes 109, 111. The comparator 140 couples to the nodes 109 and 111, and the signal (e.g., voltage signal) at the nodes 109, 111 acts as input to the comparator 140. The comparator 140, based on the inputs (or the output of the integrator 130), is configured to generate an output at a node 142.

The integrator 130, in some examples, includes a transconductance amplifier 132. In some examples, the integrator 130 includes multiple capacitors, such as capacitors 136 and 138, coupled in parallel to the transconductance amplifier 132. In some examples, the integrator 130 includes a switch 133 that couples to the node 106 such that the switch 133 controls, at least partially, the charging/discharging of the capacitor 136. The integrator 130 also includes a switch 135 that couples to the node 104 such that the switch 135 controls, at least partially, the charging/discharging of the capacitor 138. In some examples, the integrator 130 includes a switch 131 that is configured to provide a short circuit connection between the nodes 106, 111. The integrator 130 also includes a switch 137 that is configured to provide a short circuit connection between the nodes 104, 109. In some examples, the integrator 130 includes other types of amplifiers, such as voltage amplifiers. In some examples, the integrator 130 may include an additional number of parallel capacitors than the ones depicted in FIG. 1. In some examples, the turning on/off of the switches 131, 133, 135, and 137 is controlled by the controller unit 180.

In some examples, the DAC 110, the switch network 120, the integrator 130, and the comparator 140 may be integrated on a semiconductor die. In some examples, the controller 180 may be integrated on the same semiconductor die as the components mentioned above. In other examples, the controller 180 may be integrated on a different semiconductor die, but is configured to couple to the analog circuit components described above.

As noted above, the present disclosure replaces the need for additional sampling capacitors to generate the digitally produced reference value. To realize this, the counters 150, 160 are employed. The digitally produced reference value is produced in the Σ-Δ ADC 100 as follows: when the comparator 140 outputs 1, the sampling capacitors 105 and 107 sample −V, which is further provided to the nodes 109, 111 (assuming hereafter the closed-loop gain of integrator 130 is equal to 1 for the sake of simplicity). The counter 160 value, in the example where the comparator outputs 1, is increased by 1, and the counter 150 value is increased by a scaling factor (or a pre-defined value) P. On the other hand, when the comparator 140 outputs 0, the sampling capacitors 105 and 107 sample +ΔV, which is further provided to the nodes 109, 111. The counter 160 remains as is, but the counter 150 is incremented by 1. The device temperature can then be calculated by the controller 180 using the following expression:

$$T(°C.) = \frac{V\_Counter}{\Delta V\_Counter + \{P * V\_Counter\}} * GainTrim - OffsetTrim \quad (1)$$

where ΔV_Counter+{P*V_Counter} is the digitally produced reference value, and the gain and offset trims are digital constants. The values of gain and offset trims digital constants and the scaling factor P can be stored in the controller unit 180. For instance, for counter 150, 160 values of 2289, 221, respectively, and the scaling factor P, gain trim, and offset trim values of 7.08, 5227, and 273.15, respectively, the controller 180 calculates the device temperature to be about 27 degrees Celsius.

Stated another way, in order to digitally produce the reference value, the Σ-Δ ADC 100 must follow the mathematical function (equation 2) shown below:

$$V_{nodes\,101,102} = \begin{cases} \Delta V, & \text{Comparator } 140 = '0' \\ -V, & \text{Comparator } 140 = '1' \end{cases} \quad (2)$$

Equation 2 shows that in a scenario where the comparator output is 0, the voltage across nodes 101, 102 needs to be ΔV. On the other hand, if the comparator output is 1, the voltage across nodes 101, 102 needs to be −V. It is clear that the output of the integrator 130 depends on the signal/voltage present between the nodes 101, 102 and the output of the integrator 130 is the potential difference of the nodes 109, 111. As noted above, this voltage difference acts as the input to the comparator 140. Per equation 2, the integrator 130 and the counters 150, 160 are implemented in the following manner: whenever the integrator 130 output is less than zero, the voltage at the nodes 101, 102 is ΔV and the counter 150 (for that time period) is incremented by 1, and a charge transfer occurs (further explained below) such that the voltage at the nodes 109, 111 increases by ΔV. Whenever the integrator output is greater than or equal to zero, the reference signal (or in this example, the input voltage V) is provided to the nodes 101, 102 and is sampled by a single set of unit capacitors. A charge transfer occurs such that the voltage at the nodes 109, 111 decreases by V. During this time period, the counter 160 is incremented by 1 and the counter 150 is incremented by the scaling factor P. This scaling factor is the factor by which the sampling capacitors were to be scaled if the previously used technique involving increasing the number of sampling capacitors were to be implemented. Using above described process changes the output of the integrator 130 based on the output of the comparator 140.

Figure 2:
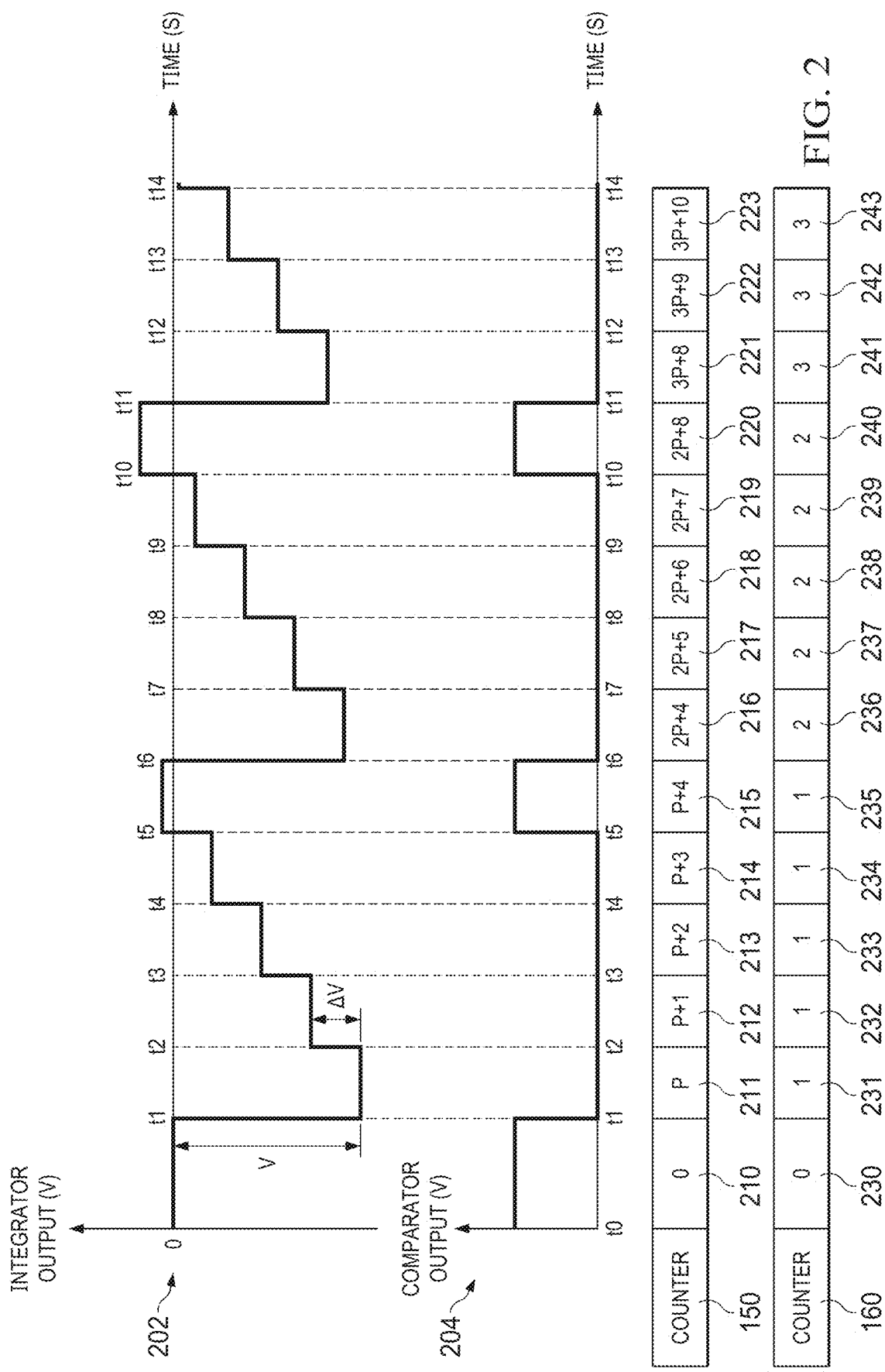
FIG. 2 depicts an illustrative timing diagram related to a hybrid sigma-delta ADC, in accordance with various examples.
Figure 4:
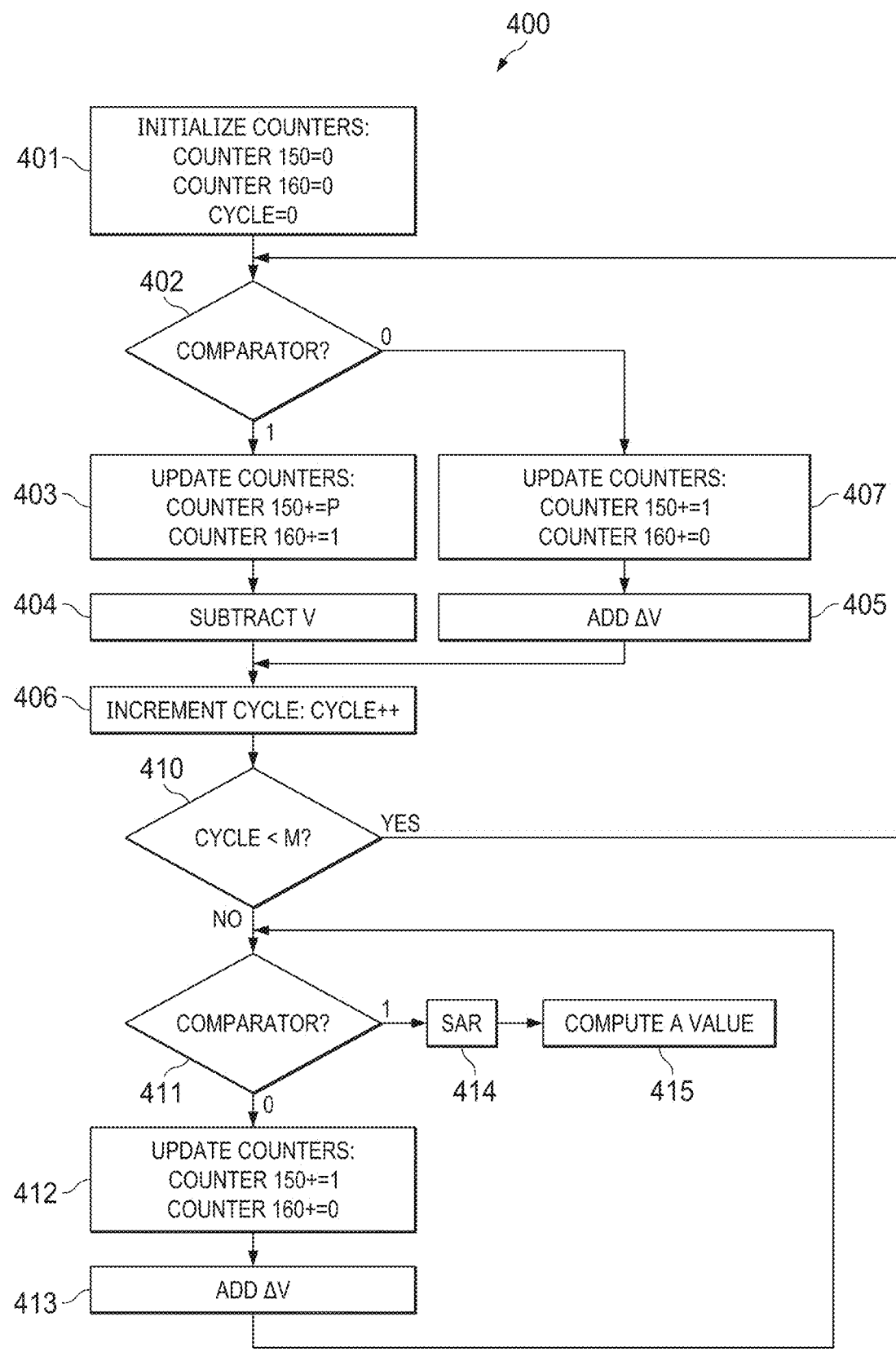
FIG. 4 depicts an illustrative method describing the function of the hybrid sigma-delta ADC.

The steady-state operation of the Σ-Δ ADC 100 is now described in tandem with FIG. 1, FIG. 2, and FIG. 4. FIG. 2 includes a graph 202 depicting an illustrative output of the integrator 130. FIG. 2 also includes a graph 204 depicting an illustrative output of the comparator 140, and illustrative counters 150, 160 depicting example counter values based on the comparator 140 values. FIG. 4 illustrates method 400 describing the function of the Σ-Δ ADC 100. The steady state operation assumes that the switch network 120 receives the input signal ΔV and that the DAC 110 receives the input signal V.

The method 400 begins with step 401 that initializes the counters 150, 160 (see FIG. 2). In other words, at time instant $t_0$, the counter 150, 160 values are zero. At this point, the cycle counter 170 is also zero—meaning that no integration cycle has occurred (see block 210, 230 in FIG. 2). After initializing the counters 150, 160, and 170; the method 400 moves to step 402 where the controller 180 examines the comparator 140 output.

As a starting point, assume that the comparator 140 output at the node 142 is digital 1. Upon examining the comparator 140 output, the controller 180 increments the counter 150 by P (see FIG. 2; block 211 of counter 150) and the counter 160 by 1 (see FIG. 2; block 231 of counter 160). Following adding the counter value, the controller unit 180 facilitates subtracting V from the integrator 130 output (step 404). In other words, the output of the integrator is generated using the input signal V. The controller unit 180 does so by strategically turning on/off the switches 112, 114, 116, 118, 122, 124, 126, and 128 via the switch control 174. The −V voltage is transferred to the nodes 109, 111, in some examples, by a correlated double sampling technique, which occurs in two phases (for the sake of simplicity, assuming hereafter the closed-loop gain of integrator 130 during correlated double sampling is also equal to 1). The first phase includes charging the input sampling capacitors 105, 107 by turning on the switches 114, 116, 137, and 131 while keeping the other switches 112, 118, 122, 124, 126, 128, 133, and 135 turned off. In this phase, the amplifier 132 functions with a gain of 1. The correlated double sampling process proceeds with the second phase that includes turning on the switches 112, 118, 133, and 135 while turning off the rest of the switches 114, 116, 122, 124, 126, 128, 131, and 137. The second phase transfers charges from the input sampling capacitors 105, 107 to the capacitors 136, 138 such that the voltage at the nodes 109, 111 is −V. The −V voltage potential at the nodes 109, 111 modifies the comparator 140 output from digital 1 to digital 0 (see time $t_1$ in the graph 204). At this point, the processor 147 increments the counter 170 by 1, meaning that one integration cycle has occurred (step 406).

In examples, the number of integration cycles of the Σ-Δ ADC 100 is fixed. Therefore, in some examples, the processor 147 examines the count value of the counter 170 and checks it against the fixed number of cycles M (step 410). If the number of cycles is less than the fixed number M, the method 400 moves to step 402 where the controller 180 (or the processor 147) checks the comparator output (step 402) and performs the necessary steps. The new comparator 140 output (i.e., digital 0) prompts the counter 150 to increment by 1 (block 212 of counter 150) and the counter 160 to increment by 0 so that the value of the counter 160 (block 232) remains equal to the previous value of the counter 160 (block 231) (step 407).

Following that, the controller unit 180 begins increasing the integrator 130 output (nodes 109, 111) by ΔV (step 405). In other words, in the scenario where the comparator output is 0, the output of the integrator is generated using the input signal ΔV. The controller unit 180 does so by turning on/off the switches 112, 114, 116, 118, 122, 124, 126, 128, via the switch control 174. This turning on/off of the switches results in a charge transfer between the capacitors 105, 136, and the capacitors 107, 138, such that a +ΔV potential is added across the nodes 109, 111 (see time instant $t_2$ in the graph 202). Stated another way, when the comparator output is 0 (see time instances $t_1$-$t_4$; $t_6$-$t_9$; $t_{11}$-$t_{14}$ of graphs 202, 204), a +ΔV potential is added across the nodes 109, 111. As noted above, this charge transfer, in some examples, is done using correlated double sampling, which occurs in two phases. The first phase includes charging the input capacitors 105, 107 with +ΔV by turning on the switches 122, 128, 131, and 137, and turning off the rest of the switches 124, 126, 112, 114, 116, 118, 133, and 135. The second phase includes turning on the switches 124, 126, 133, 135, and turning off the rest of the switches 112, 114, 116, 118, 122, 128, 131, and 137. Following this switching, a +ΔV potential difference appears across the nodes 109, 111. This +ΔV potential change keeps the output of the comparator 140 as is (see time $t_2$ in the graph 204), because the input of the comparator is −V+ΔV, which is less than zero (or the threshold defined for the comparator). At this point, the method 400 moves to step 406 and increments the counter 170 value, and the processor 410 again compares the counter 170 value against the fixed number of cycles M. Since the comparator output at time instant $t_2$ is 0, the counter 150 is incremented by 1 and the counter 160 value remains as is (see block 213 of counter 150 and block 233 of the counter 160).

At this point, the output of the integrator 130 continues to increase with a +ΔV increment (see time instances $t_3$ and $t_4$) and the controller 180 performs the functions described above for steps 402, 407, 405, 406, and 410. At time instant $t_5$, the integrator output (or the comparator input) increases relative to the threshold (or zero). This condition modifies the comparator output from digital 0 to digital 1 (graph 204, time between instances $t_5$, $t_5$), which prompts the controller 180 to facilitate reducing the integrator output by −V. At this point, the controller 180 performs functions described above for steps 403, 404, 406, and 410.

As noted above, the number of cycles for the Σ-Δ ADC 100 is fixed. The method 400, therefore, will reach a condition where the step 410 outputs a "no" meaning that the number of integration cycles is equal to or has exceeded the predefined fixed number of cycles M. In some examples, the output voltage (or "residue voltage" or "residue") of the integrator is not zero at the end of the completion of the fixed number of cycles. This may cause the computations of temperature using counter values of the counters 150, 160 to be in error because counter 150*ΔV−counter 160*V=Residue, a small, non-zero voltage. Since the last cycle could be the subtraction of V (or, in other words, a −V drop), the residue is bound in the range from +ΔV to −V.

Figure 3:
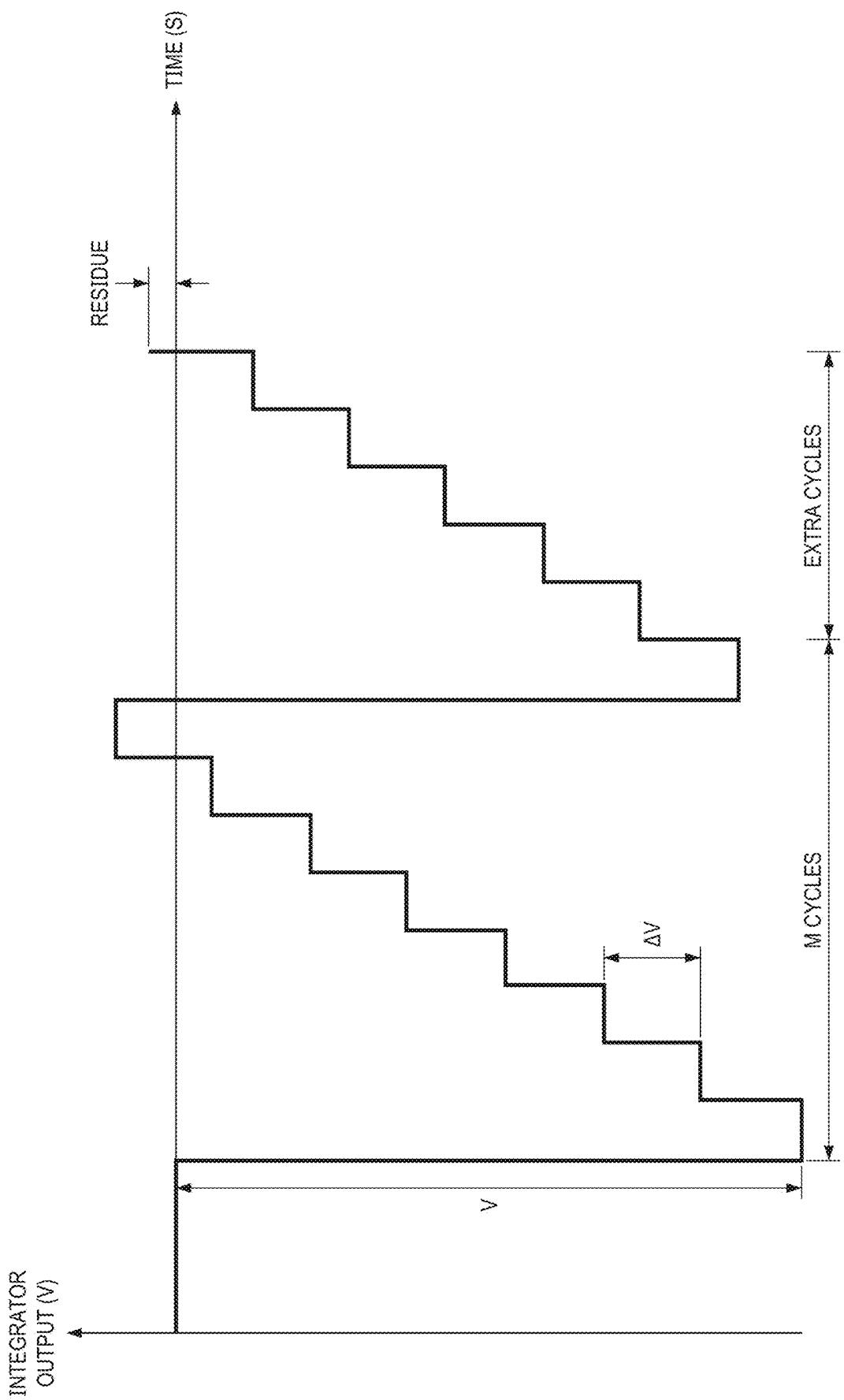
FIG. 3 depicts a sub-ranging mode relating to the hybrid sigma-delta ADC, in accordance with various examples.

Referring now to FIG. 3, a sub-ranging mode that is configured to be performed by the Σ-Δ ADC 100 is shown. Since ΔV is smaller than V, the residue can be reduced in absolute amplitude by performing additional integration cycles by adding ΔV until the integrator output becomes positive. These additional integration cycles can be performed after the completion of the number of fixed integration cycles M. Therefore, the method 400, following the determination done in step 410 that the counter 170 value is equal to or greater than the fixed number of integration cycles M, the method 400 moves to step 411 to examine the comparator 140 output. If the comparator output is zero, meaning that the integrator output is negative, additional ΔV cycles are added to the counter 150 (steps 412, 413) until the point the comparator 140 output increases relative to zero (or the predefined threshold). At this point, the residue is bound in the range from 0 to +ΔV (see FIG. 3).

Limiting the residue from 0 to +ΔV increases the effective resolution of the Σ-Δ ADC 100. In some examples, the method 400 can proceed to step 414, further improving the resolution of the Σ-Δ ADC 100. In one example, this is done by a cyclic successive approximation register (SAR) process, or cyclic-SAR process. Integrator 130 can be adapted to execute a cyclic-SAR algorithm in order to quantify the ratio of the residue voltage to the ΔV input voltage. A cyclic-SAR cycle includes doubling the residue voltage and comparing the magnitude to the ΔV input voltage. This comparison is done by the controller 180. An example realization would include a feedback switch between node 111 and node 101 and another feedback switch between 109 and node 102.

Furthermore, other additional switches may be employed in order for the ratio of feedback capacitors to input sampling capacitors to be equal to two. These additional switches are used to double the residue voltage at the output of integrator 130 and compare it to the ΔV input voltage, thereby improving the resolution of the Σ-Δ ADC 100. Following the step 414, in some examples, the method 400 moves to calculate a value (step 415) (e.g., temperature value) by the controller 180 using the equation 1 and values of the counters 150, 160.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

The invention claimed is:

1. A circuit for sensing temperature in integrated circuits, comprising:
  a bandgap circuit to provide a VBE voltage signal and a ΔVBE voltage signal;
  a set of first input switches coupled respectively to a first input node and a second input node, the first input switches to receive the ΔVBE voltage signal;
  a set of second input switches coupled respectively to the first input node and the second input node, the second input switches to receive the VBE voltage signal;
  a sigma delta analog to digital converter (ADC), including
    an integrator including a first sampling capacitor and a second sampling capacitor, respectively coupled to the first input node and the second input node, the integrator to generate differential integrator output signals, and
    a comparator coupled to the integrator and configured to generate a comparator output signal based on the differential integrator output signals; and
  the first input switches controllable by a first switch control signal to provide to the first and second nodes an input ΔVBE voltage signal;
  the second input switches controllable by a feedback digital control signal to operate as digital-to-analog converter (DAC) circuitry to provide to the first and second input nodes an input VBE voltage signal;
  the integrator to generate the differential integrator output signals based on sampling with the first and second sampling capacitors either the input ΔVBE voltage signal or the input VBE voltage signal; and
  a controller unit coupled to the first and second input switches, the integrator, and the comparator, the controller unit operable in each of successive integration cycles to generate the first switch control signal and the feedback digital control signal such that:
    if the comparator output signal is a first value, then the sampled input VBE voltage signal is subtracted from the differential integrator output signals, if the comparator output signal is a second value, then the sampled input ΔVBE voltage signal is added to the differential integrator output signals;

wherein the controller unit is configured to determine a temperature value based on ΔVBE/VREF, where ΔVBE is a value based on the input ΔVBE voltage signal, and VREF is a reference value generated by scaling a value based on the input VBE voltage signal;

wherein the controller unit includes a ΔVBE counter associated with the input ΔVBE voltage signal, and a VBE counter associated with the input VBE voltage signal, and is configured:

if the comparator output signal is the first value, so that the sampled input VBE voltage signal is subtracted from the differential integrator output signals, to increment the ΔVBE counter value by a defined scale factor P, and the VBE counter value by 1, and if the comparator output signal is the second value, so that the sampled input ΔVBE voltage signal is added to the differential integrator output signals, to increment the ΔVBE counter value by the 1, and the VBE counter value by 0; and to generate the temperature value based on the ΔVBE counter value and the VBE counter value according to:

$$\Delta VBE/VREF = N/[K+(P*N)]$$

where N=VBE counter value, and K=ΔVBE counter value.

2. A circuit for sensing temperature in integrated circuits, comprising:

a bandgap circuit to provide a VBE voltage signal and a ΔVBE voltage signal;

a set of first input switches coupled respectively to a first input node and a second input node, the first input switches to receive the ΔVBE voltage signal;

a set of second input switches coupled respectively to the first input node and the second input node, the second input switches to receive the VBE voltage signal;

a sigma delta analog to digital converter (ADC), including
an integrator including a first sampling capacitor and a second sampling capacitor, respectively coupled to the first input node and the second input node, the integrator to generate differential integrator output signals, and
a comparator coupled to the integrator and configured to generate a comparator output signal based on the differential integrator output signals; and the first input switches controllable by a first switch control signal to provide to the first and second nodes an input ΔVBE voltage signal;

the second input switches controllable by a feedback digital control signal to operate as digital-to-analog converter (DAC) circuitry to provide to the first and second input nodes an input VBE voltage signal;

the integrator to generate the differential integrator output signals based on sampling with the first and second sampling capacitors either the input ΔVBE voltage signal or the input VBE voltage signal; and a controller unit coupled to the first and second input switches, the integrator, and the comparator, the controller unit operable in each of successive integration cycles to generate the first switch control signal and the feedback digital signal such that:

if the comparator output signal is a first value, then the sampled input VBE voltage signal is subtracted from the differential integrator output signals, if the comparator output signal is a second value, then the sampled input ΔVBE voltage signal is added to the differential integrator output signals;

wherein the controller unit is configured to perform a defined number of integration cycles M;

wherein after performing the defined number of integration cycles M, the controller unit is configured to perform an additional number of integration cycles until the comparator output signal is the first value, limiting a residue value to a range of zero to −ΔVBE.

3. The temperature sensor of claim 2, wherein, after the additional number of integration cycles, the controller unit and the integrator are configured to perform a cyclic successive approximation operation to quantify a ratio of the residue value to the input ΔVBE voltage, including doubling the residue value and comparing the magnitude to the input ΔVBE voltage.

4. A circuit for sensing temperature in integrated circuits, comprising:

a bandgap circuit to provide a VBE voltage signal and a ΔVBE voltage signal;

a set of first input switches coupled respectively to a first input node and a second input node, the first input switches to receive the ΔVBE voltage signal;

a set of second input switches coupled respectively to the first input node and the second input node, the second input switches to receive the VBE voltage signal;

a sigma delta analog to digital converter (ADC), including
an integrator including a first sampling capacitor and a second sampling capacitor, respectively coupled to the first input node and the second input node, the integrator to generate differential integrator output signals, and
a comparator coupled to the integrator and configured to generate a comparator output signal based on the differential integrator output signals; and the first input switches controllable by a first switch control signal to provide to the first and second nodes an input ΔVBE voltage signal;

the second input switches controllable by a feedback digital control signal to operate as digital-to-analog converter (DAC) circuitry to provide to the first and second input nodes an input VBE voltage signal;

the integrator to generate the differential integrator output signals based on sampling with the first and second sampling capacitors either the input ΔVBE voltage signal or the input VBE voltage signal; and a controller unit coupled to the first and second input switches, the integrator, and the comparator, the controller unit operable in each of successive integration cycles to generate the first switch control signal and the feedback digital signal such that:

if the comparator output signal is a first value, then the sampled input VBE voltage signal is subtracted from the differential integrator output signals, if the comparator output signal is a second value, then the sampled input ΔVBE voltage signal is added to the differential integrator output signals;

wherein the controller unit is configured to determine a temperature value based on ΔVBE/VREF, where ΔVBE is a value based on the input ΔVBE voltage signal, and VREF is a reference value generated by scaling a value based on the input VBE voltage signal;

wherein the controller unit includes a ΔVBE counter associated with the input ΔVBE voltage signal, and a VBE counter associated with the input VBE voltage signal, and is configured:

if the comparator output signal is the first value, so that the sampled input VBE voltage signal is subtracted from the differential integrator output signals, to increment the ΔVBE counter value by a defined scale factor P, and the VBE counter value by 1; and if the comparator output signal is the second value, so that the sampled input ΔVBE voltage signal is added to the differential integrator output signals, to increment the ΔVBE counter value by the 1, and the VBE counter value by 0; and to generate the temperature value based on the ΔVBE counter value and the VBE counter value, according to:

$$\Delta VBE/VREF = N/[K+(P*N)]$$

where N=VBE counter value, and K=ΔVBE counter value.

5. An integrated circuit including an integrated temperature sensor, comprising:

a bandgap circuit to provide a VBE voltage signal and a ΔVBE voltage signal;

a set of first input switches coupled respectively to a first input node and a second input node, the first input switches to receive the ΔVBE voltage signal;

a set of second input switches coupled respectively to the first input node and the second input node, the second input switches to receive the VBE voltage signal;

a sigma delta analog to digital converter (ADC), including:
   an integrator including a first sampling capacitor coupled to the first input node, and a second sampling capacitor coupled to the second input node, the integrator to generate differential integrator output signals, and
   a comparator coupled to the integrator and configured to generate a comparator output signal based on the differential integrator output signals; and the first input switches controllable by a first switch control signal to provide to the first and second nodes an input ΔVBE voltage signal;

the second input switches controllable by a feedback digital control signal to operate as digital-to-analog converter (DAC) circuitry to provide to the first and second input nodes an input VBE voltage signal;

the integrator to generate the integrator output signal based on sampling with the first and second sampling capacitors either the input ΔVBE voltage signal or the input VBE voltage signal; and a controller unit coupled to the first and second input switches, the integrator, and the comparator, the controller unit operable in each of successive integration cycles to generate the first switch control signal and the feedback digital signal such that:
   if the comparator output signal is a first value, then the sampled input VBE voltage signal is subtracted from the integrator output signal,
   if the comparator output signal is a second value, then the sampled input ΔVBE voltage signal is added to the integrator output signal;

wherein the controller unit is configured to perform a defined number of integration cycles M;

wherein after performing the defined number of integration cycles M, the controller unit is configured to perform an additional number of integration cycles until the comparator output signal is the first value, limiting a residue value to a range of zero to −ΔVBE.

6. The integrated circuit of claim 5, wherein, after the additional number of integration cycles, the controller unit and the integrator are configured to perform a cyclic successive approximation operation to quantify a ratio of the residue value to the input ΔVBE voltage, including doubling the residue value and comparing the magnitude to the input ΔVBE voltage.

7. A method of sensing temperature in integrated circuits, comprising:

providing from an integrated bandgap circuit a VBE voltage signal and a ΔVBE voltage signal;

in successive integration cycles,
   cooperatively switching the ΔVBE voltage signal and the VBE voltage signal, in response respectively to a first switch control signal and a second switch control signal,
   sampling with a set of first and second sampling capacitors, either the ΔVBE voltage signal or the VBE voltage signal; and in each integration cycle,
   integrating either the sampled ΔVBE voltage signal or the sampled VBE voltage signal to generate a differential integrator output signal, and
   generating, based on a comparison of the differential integrator output signal, either a first comparison value or a second comparison value, and generating the first and second switch control signals such that:
      if the first comparison value, then the sampled VBE voltage signal is subtracted from the differential integrator output signal, and
   if the second comparison value, then the sampled ΔVBE voltage signal is added to the differential integrator output signal;

further comprising:
determining a temperature value based on ΔVBE/VREF, where ΔVBE is a digital value based on the ΔVBE voltage signal, and VREF is a digital reference value generated by scaling a digital value based on the VBE voltage signal;

wherein the temperature value is determined from a ΔVBE counter value associated with the ΔVBE voltage signal, and a VBE counter value associated with the VBE voltage signal, based on:
   if the first comparison value, such that the sampled input VBE voltage signal is subtracted from the differential integrator output signal, incrementing the ΔVBE counter value by a defined scale factor P, and the VBE counter value by 1; and
   if the second comparison value, such that the sampled ΔVBE voltage signal is added to the differential integrator output signal, incrementing the ΔVBE counter value by the 1, and the VBE counter value by 0; and generating the temperature value based on the ΔVBE counter value and the VBE counter value, according to:

$$\Delta VBE/VREF = N/[K+(P*N)]$$

where N=VBE counter value, and K=ΔVBE counter value.

8. A method of sensing temperature in integrated circuits, comprising:

providing from an integrated bandgap circuit a VBE voltage signal and a ΔVBE voltage signal;

in successive integration cycles, cooperatively switching the ΔVBE voltage signal and the VBE voltage signal, in response respectively to a first switch control signal and a second switch control signal, sampling with a set of first and second sampling capacitors, either the ΔVBE voltage signal or the VBE voltage signal; and in each integration cycle, integrating either the sampled ΔVBE voltage signal or the sampled VBE voltage signal to generate a differential integrator output signal, and generating, based on a comparison of the differential integrator output signal, either a first comparison value or a second comparison value, and generating the first and second switch control signals such that:

if the first comparison value, then the sampled VBE voltage signal is subtracted from the differential integrator output signal, and if the second comparison value, then the sampled ΔVBE voltage signal is added to the differential integrator output signal;

wherein a defined number of integration cycles M are performed;

wherein after performing the defined number of integration cycles M, performing an additional number of integration cycles until the first comparison value is obtained, limiting a residue value to a range of zero to −ΔVBE.

9. The method of claim 8, wherein, after the additional number of integration cycles, performing a cyclic successive approximation to quantify a ratio of the residue value to the ΔVBE voltage, including doubling the residue value and comparing the magnitude to the ΔVBE voltage.

* * * * *